US005994162A

United States Patent [19]

Burghartz et al.

[11] Patent Number: 5,994,162

[45] Date of Patent: Nov. 30, 1999

[54] INTEGRATED CIRCUIT-COMPATIBLE PHOTO DETECTOR DEVICE AND FABRICATION PROCESS

[75] Inventors: Joachim Norbert Burghartz, Shrub Oak, N.Y.; Mark B Ritter, Danbury, Conn.; Uli Klepser, Munich, Germany

[73] Assignee: International Business Machines Corporation, Armonk, N.Y.

[21] Appl. No.: 09/018,942

[22] Filed: Feb. 5, 1998

[51] Int. Cl.[6] .......................... H01L 21/265; H01L 21/00

[52] U.S. Cl. .............................. 438/57; 438/72; 438/309; 438/527; 438/341

[58] Field of Search .................................. 438/72, 98, 48, 438/57, 41, 202, 203, 204, 205, 234, 235, 236, 59, 478, 481, 514, 526, 527, 341, 369, 374, 442; 257/461, 462, 187, 186, 184, 431, 432

[56] References Cited

U.S. PATENT DOCUMENTS

| | | | |
|---|---|---|---|
| 4,318,115 | 3/1982 | Yoshikawa et al. | 257/435 |
| 4,343,014 | 8/1982 | Jaecklin | 257/118 |
| 4,355,320 | 10/1982 | Tihanyi | 257/462 |
| 4,524,375 | 6/1985 | Baumgartner et al. | 257/462 |
| 5,268,309 | 12/1993 | Mizutani et al. | 438/59 |
| 5,466,954 | 11/1995 | Alzpuru et al. | 257/187 |
| 5,587,596 | 12/1996 | Chi et al. | 257/462 |

(List continued on next page.)

OTHER PUBLICATIONS

S. Sze, "Physics of Semiconductor Devices", pp. 782–787, Whiley & Sons.

J. N. Burghartz, "BiCMOS Process Integration and Device Optimization: Basic Concepts and New Trends", Electrical Engineering 79 (1996) 313–327.

*Primary Examiner*—Savitri Mulpuri

*Attorney, Agent, or Firm*—Robert P. Tassinari, Jr.; Walter W. Duft

[57] ABSTRACT

An integrated circuit-compatible photo detector is disclosed which is particularly compatible with BiCMOS fabrication processes. In a first aspect, the photo detector is formed as a lateral phototransistor having a semiconductor substrate, a base structure formed as a first impurity region in the substrate, an emitter structure formed as a second impurity region in the first impurity region, and a collector structure formed by the substrate and by a pair of third and fourth impurity regions in the substrate on opposite sides of the first and second impurity regions. An emitter contact is electrically connected to the second impurity region, while a pair of collector contacts are electrically connected to the third and fourth impurity regions and to each other. An anti-reflective coating is applied to at least the base structure. Advantageously, if a photodiode is required instead of a phototransistor, the second impurity region can be formed with the same polarity as the first impurity region, in which case the first and second impurity regions form a cathode (or anode) and the third and fourth impurity regions form an anode (or cathode). In a second aspect, the photo detector is formed as a lateral phototransistor having a semiconductor substrate, a base structure formed by the substrate, an emitter structure formed as a first impurity region in the substrate, and a collector structure formed as a pair of second and third impurity regions in the substrate on opposite sides of the first impurity region. An emitter contact is electrically connected to the first impurity region, while a pair of collector contacts are electrically connected to the second and third impurity regions and to each other. An anti-reflective coating is applied to at least the base structure. Advantageously, if a photodiode is required instead of a phototransistor, the first impurity region can be formed with the same polarity as the substrate, in which case the substrate and the first impurity region form an anode (or cathode) and the second and third impurity regions form a cathode (or anode).

6 Claims, 4 Drawing Sheets

U.S. PATENT DOCUMENTS

| | | | |
|---|---|---|---|
| 5,672,906 | 9/1997 | Saito et al. | 257/617 |
| 5,721,447 | 2/1998 | Oosawa et al. | 257/461 |
| 5,763,909 | 6/1998 | Mead et al. | 257/462 |
| 5,767,538 | 6/1998 | Mullins et al. | 438/57 |
| 5,786,623 | 7/1998 | Bergemont et al. | 257/462 |
| 5,801,430 | 9/1998 | Forrest et al. | 257/431 |
| 5,837,574 | 11/1998 | Bergemont et al. | 257/462 |
| 5,854,100 | 12/1998 | Chi | 438/202 |
| 5,898,209 | 4/1999 | Takakura | 257/440 |
| 5,904,493 | 5/1999 | Lee et al. | 438/57 |

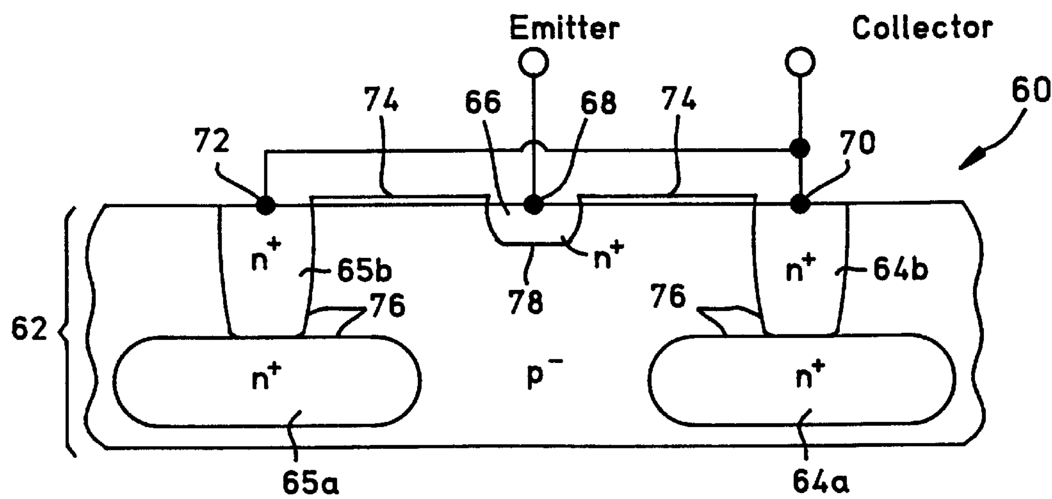
Fig. 5
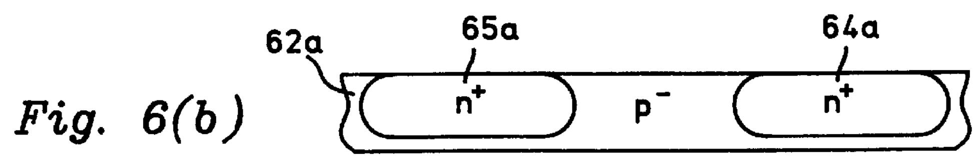
Fig. 6(a)
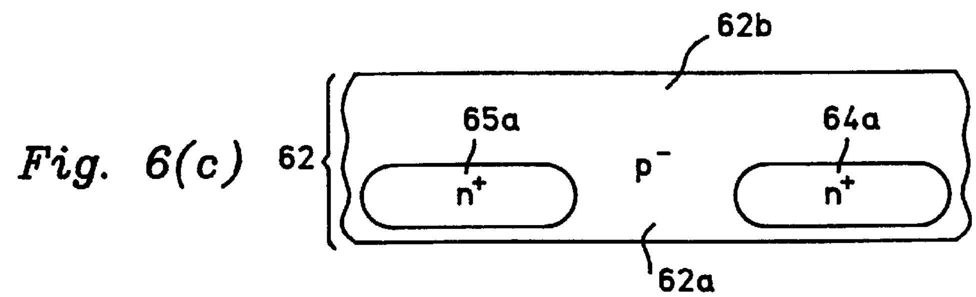
Fig. 6(b)
Fig. 6(c)
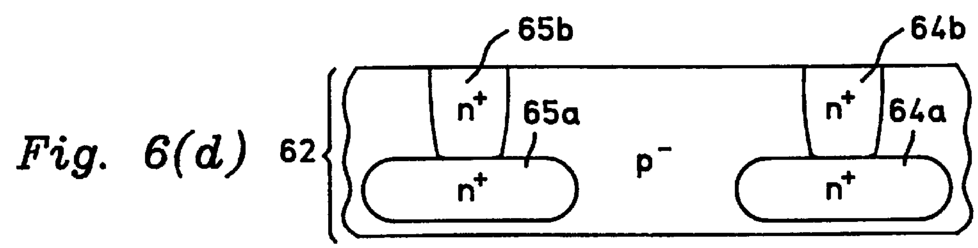
Fig. 6(d)
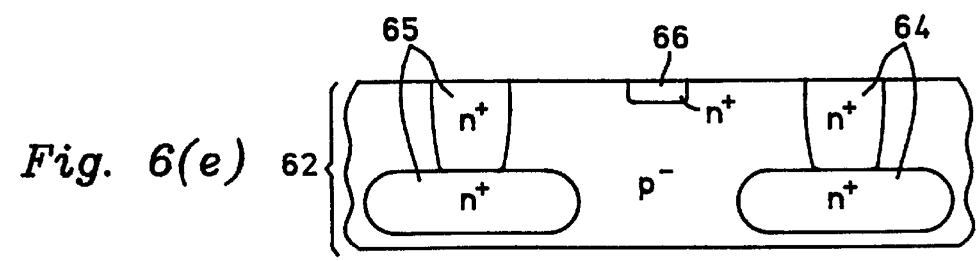
Fig. 6(e)

INTEGRATED CIRCUIT-COMPATIBLE PHOTO DETECTOR DEVICE AND FABRICATION PROCESS

BACKGROUND OF THE INVENTION

The present invention is directed generally to photo detector devices fabricated on semiconductor substrates. More particularly, the invention relates to photo detectors manufactured as part of semiconductor integrated circuits. Still more particularly, the invention concerns photo detector structures formed using BiCMOS process integration and device optimization techniques for integrated circuit designs. From an operational standpoint, the invention is directed, but not necessarily limited, to photo detector devices for infrared (IR) wireless and optical fiber applications.

The drive towards monolithic optical transceiver systems and optical fiber drivers and receivers creates a need for photo detectors that are integrated in full compatibility with main-stream silicon fabrication processes, such as state-of-the-art BiCMOS production. If such photo detectors are used for IR-wireless applications, their designs have to focus on a maximum signal-to-noise ratio. In contrast, designs for optical fiber system applications require high-frequency photo detectors.

Photodiodes operated under reverse bias conditions are one type of semiconductor optical device that have been used extensively in the past. Such devices generally have good response speed, but minimal quantum efficiency. Thickening the depletion region increases quantum efficiency but at the expense of response speed. The location of the depletion region relative to the light impinging surface also affects performance, because short wavelength light is absorbed near the device surface, while longer wavelength light reaches further below the device surface. A depletion region that is too deep will thus reduce high end spectral sensitivity, as well as overall output response.

Another semiconductor photo detector device is the phototransistor. Phototransistors are typically configured as vertical bipolar structures, but with a large asymmetry of emitter area and collector area, i.e., the collector area is much larger than the emitter area. When operated with a floating base contact, phototransistors have an advantage over photodiodes in that the photo current generated at the reverse-biased collector-base junction is increased by the current gain of the transistor. The current gain, and thus the increase of the photo response over that of a photodiode, is high. This benefit, however, comes at the expense of an increased noise equivalent power and a reduced high frequency response due to the phototransistor's inherently larger collector area. Moreover, the collector-base junction is generally located at a considerable distance from the light impinging surface so that a fraction of the electron-hole pairs generated near the surface may not contribute to the photo current, thus reducing spectral sensitivity. Non-phototype lateral transistors are known in the art, but they generally have higher base resistance, and hence, slower response speed than vertical transistors. This stems, at least in part, from the fact that base width in lateral transistors is controlled relatively imprecisely by lithograpaphic techniques, whereas in vertical transistors, base width is controlled with comparative accuracy using deposition processes such as implantation, diffusion and the like.

The prior art thus lacks important features that are necessary to a fully functioning photo detector. What is needed is a photo detector that provides broad spectral bandwidth sensitivity and improved output signal intensity without sacrificing response speed. What is also required is a method for producing such photo detectors using existing integrated circuit fabrication processes, and especially state-of-the-art BiCMOS fabrication, in order to facilitate the incorporation of photo detector devices in integrated systems designed for applications such as optical fiber communications, IR-wireless transmission, and the like.

SUMMARY OF THE INVENTION

It is a primary object of the present invention to provide a photo detector that provides good spectral bandwidth sensitivity and output signal intensity.

It is a further object of the present invention to provide a photo detector having good response speed for high frequency applications.

It is a further object of the present invention to provide a photo detector process that relies on existing integrated circuit fabrication techniques, and especially state-of-the-art BiCMOS fabrication.

It is a further object of the present invention to provide a photo detector process that facilitates the incorporation of photo detector devices in integrated systems in devices designed for optical fiber and IR-wireless applications and the like.

In accordance with the foregoing objectives, an integrated circuit-compatible photo detector is provided that is constructed using lateral semiconductor structures having superior spectral bandwidth sensitivity and output signal intensity, and also having suprisingly robust response speed. In a first preferred embodiment of the invention, the photo detector is formed as a lateral phototransistor having a semiconductor substrate, a base structure formed as a first impurity region in the substrate, an emitter structure formed as a second impurity region in the first impurity region, and a collector structure formed by the substrate and by a pair of third and fourth impurity regions in the substrate on opposite sides of the first and second impurity regions. An emitter contact is electrically connected to the second impurity region, while a pair of collector contacts are electrically connected to the third and fourth impurity regions and to each other. An anti-reflective coating is applied to at least the base structure. Advantageously, if a lateral photodiode is required instead of a phototransistor, the second impurity region can be formed with the same polarity as the first impurity region, in which case the first and second impurity regions form a cathode (or anode) and the third and fourth impurity regions form an anode (or cathode).

In a second preferred embodiment of the invention, the photo detector is formed as a lateral phototransistor having a semiconductor substrate, a base structure formed by the substrate, an emitter structure formed as a first impurity region in the substrate, and a collector structure formed as a pair of second and third impurity regions in the substrate on opposite sides of the first impurity region. An emitter contact is electrically connected to the first impurity region, while a pair of collector contacts are electrically connected to the second and third impurity regions and to each other. An anti-reflective coating is applied to at least the base structure. Advantageously, if a lateral photodiode is required instead of a phototransistor, the first impurity region can be formed with the same polarity as the substrate, in which case the substrate and the first impurity region form an anode (or cathode) and the second and third impurity regions form a cathode (or anode).

The several lateral phototransistor and photodiode structures contemplated by the present invention are especially compatible with state-of-the-art BiCMOS fabrication processes. BiCMOS fabrication includes, as a minimum, the production of multiple pMOSFET, nMOSFET and bipolar transistor devices integrated on the same chip. There are various combination possibilities of such devices on a chip. Generally (but not exclusively), a p-type silicon substrate is used and the nMOSFET devices are built in a p-well formed in the p-substrate (the p-well may be either a p-field implant or the substrate background doping itself), while the pMOSFET devices are fabricated in an n-well that is diffused into the p-substrate. An n-well is also often used as the collector region of the bipolar (npn) transistors. A highly doped n-type buried layer is typically formed under the n-collector region of the (npn) transistors to reduce the collector resistance. A reach-through n-type implant establishes contact to the buried layer from the surface of the device. The above polarities are reversed in devices formed on n-type silicon substrates. Also, pnp transistors can be formed in addition to, or in lieu of, npn transistors.

Advantageously, the lateral phototransistors and photodiodes of the present invention may be formed using the foregoing set of BiCMOS structural elements without significantly altering the basic BiCMOS fabrication process. To produce pnp-type lateral phototransistors using a p-type substrate BiCMOS process, the source/drain (S/D) implants of the pMOSFET can be used as an emitter, the n-well of the pMOSFET can be used as a base, and the substrate, preferably enhanced with a p-field implant, can be used as an intrinsic collector region. A pair of extrinsic collector contacts can be made by forming pMOSFET-S/D implants outside of the n-well. To produce npn-type lateral phototransistors using a p-type substrate BiCMOS process, a collector can be fabricated from the buried layer and the reach-through contact of the npn transistor, the substrate background doping can be used for a base, and the nMOSFET S/D implants can be used as an emitter. In this way, novel photo detector structures can be fabricated while using well-established process modules.

BRIEF DESCRIPTION OF THE DRAWING

The objects, advantages and features of the present invention will be more clearly understood by reference to the following detailed disclosure and the accompanying drawing in which:

FIG. 5 is a diagrammatic side view showing a lateral npn phototransistor constructed in accordance with the present invention on a p-type substrate;

FIG. 6, which includes subparts (*a*), (*b*), (*c*), (*d*) and (*e*), is a series of diagrammatic side views showing steps in the fabrication of the phototransistor of FIG. 5;

DETAILED DESCRIPTION OF THE PREFERRED EMBODIMENTS

Figure 1:
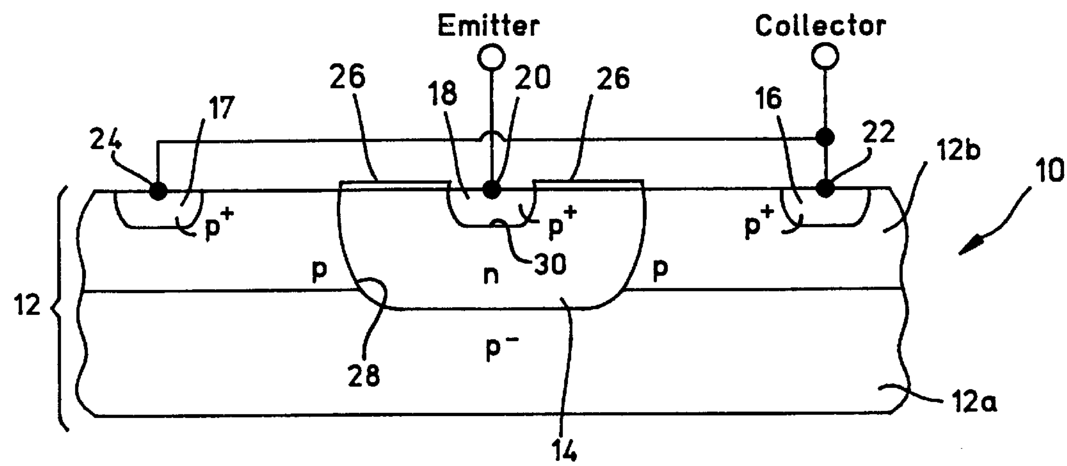
FIG. 1 is a diagrammatic side view of a pnp lateral phototransistor constructed in accordance with the present invention on a p-type substrate.
Figure 2A:
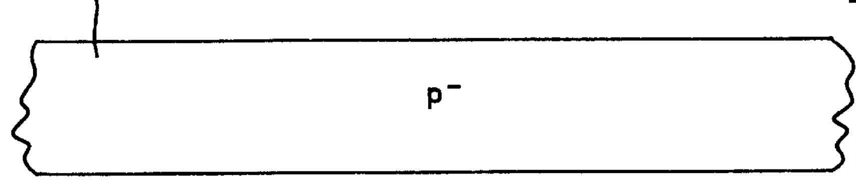
FIG. 2, which includes subparts (*a*), (*b*), (*c*) and (*d*) is a series of diagrammatic side views showing steps in the fabrication of the phototransistor of FIG. 1.
Figure 2B:
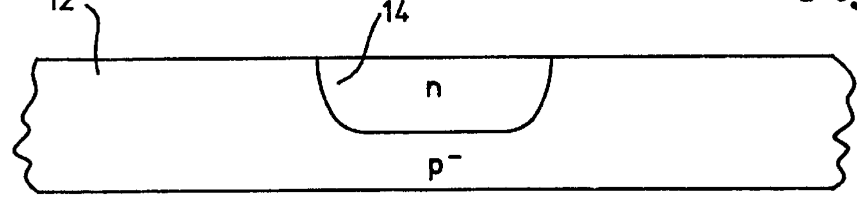
Figure 2C:
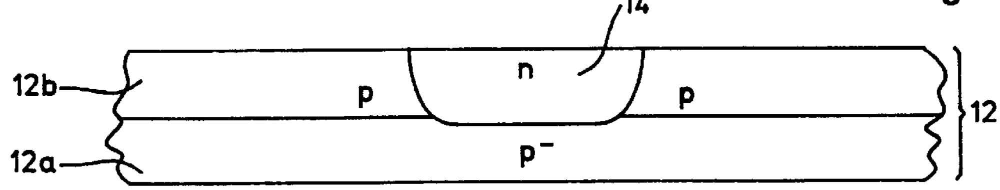
Figure 2D:
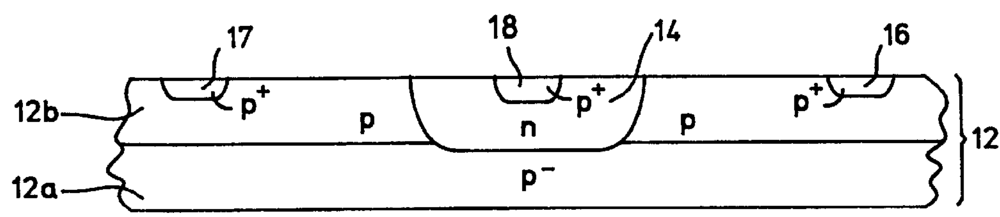

Referring now to the drawing figures wherein like reference numerals denote like structure in all of the several views, FIG. 1 illustrates a configuration for a lateral pnp-phototransistor 10, while FIG. 2 illustrates the fabrication process flow used in the formation of the phototransistor 10. The fabrication of the phototransistor 10 begins with a semiconductor wafer substrate 12 which is preferably made from silicon having a relatively light $p^-$ background doping at a concentration of $<10^{16}$ $cm^{-3}$, to produce a nominal resistivity of about 10 to 100 Ω-cm. Although the substrate 12 is preferably made from silicon, other semiconductor materials could also be used. In addition, although the substrate 12 has p-type doping, n-type doping could also be used. In that case, the polarities of the structures now to be described would be reversed.

The several photo detector structural elements now to be described are variously referred to as being "formed," "implanted," "placed," and the like, during fabrication. Unless otherwise stated, the use of such terminology is not intended to define process limitations insofar as many different semiconductor fabrication techniques may be used. These applicable techniques, to name a few, include substrate and film formation using crystal growth and epitaxy, oxidation and film deposition, and metallization. Additional applicable techniques include doping technologies such as diffusion and ion implantation. Further applicable techniques include shaping and pattern forming technologies such as optical, electron beam, X-ray and ion beam lithography, and etching. It will be apparent to persons skilled in the art, based on the teachings herein, that various suitable combinations of these technologies may be used in the fabrication of the photo detectors of the present invention.

Following the construction of the substrate 12 in FIG. 2(*a*), an n-well 14 is formed in the upper surface of the substrate 12 in FIG. 2(*b*). The n-well 14 serves as the base region of the phototransistor 10 of FIG. 1. FIG. 2(*c*) illustrates a next processing step in which the upper surface region near the substrate 12, outside of the said n-well 14, is doped with a p-field implant at a typical doping concentration of about 10 $cm^{-3}$. The substrate 12 is thus divided into a lightly doped $p^-$ substrate region 12*a* and a heavier doped p-field region 12*b*. The $p^-$ substrate region 12*a* and the p-field region 12*b* together form an intrinsic collector in the phototransistor 10 of FIG. 1. As next shown in FIG. 2(*d*), this intrinsic collector is contacted by two $p^+$ implants 16 and 17 that are placed in the upper surface of the substrate 12 on both sides of, and spaced away from, the n-well 14. The $p^+$ implants 16 and 17 form extrinsic collectors that complete the collector of the phototransistor 10 of FIG. 1, which is thus formed in its entirety by the $p^-$ substrate region 12*a*, the p-field implant region 12*b*, and the $p^+$ implants 16 and 17. As further shown in FIG. 2(*d*), a third $p^+$ implant 18 is placed in the upper surface of the n-well 14, between the $p^+$ implants 16 and 17, and forms an emitter for the phototransistor 10 of FIG. 1.

To provide electrical connections to the phototransistor 10, an emitter contact 20 is electrically connected to the $p^+$ implant 18, and a pair of collector contacts 22 and 24 are electrically connected to the $p^+$ implants 16 and 17, and to each other. The contacts 20, 22 and 24 are conventional in nature. They are connected to leads that extend to other devices formed on the substrate 12, or to external circuit components. A conventional anti-reflective coating 26 is then preferably applied on the upper surface of the substrate 12, and extends at least over the phototransistor base formed by the n-well 14, but may also cover the collector, and the emitter.

Thus, a first phototransistor of the pnp variety has been described. As previously stated, an npn phototransistor could be similarly fabricated using an n-type substrate, in which case the polarities of the above-described elements would be reversed.

In the operation of the pnp phototransistor 10, the collector is more negatively biased than the emitter, so that the collector-base P-N junction 28, i.e., the junction formed by the n-well 14 and the substrate regions 12*a* and 12*b*, and which extends to the upper light impinging surface of the device, is reverse-biased. The emitter-base P-N junction 30, i.e., the junction formed between the n-well 14 and the $p^+$ implant 18, and which also extends to the upper light impinging surface of the device, is forward biased. When light impinges on the phototransistor 10, electron-hole pairs that are generated inside the space-charge region of the P-N junction 28, or which are generated in the neutral region of the base and diffused into the space-charge region, contribute to a photo current. Because the base, i.e, the n-well 14, is left floating, the photo current enforces a minority carrier gradient in the base so that the photo current is amplified by a factor $1+h_{FE}$, with $h_{FE}$ being the dc common-emitter current gain of the transistor 10.

Figure 3:
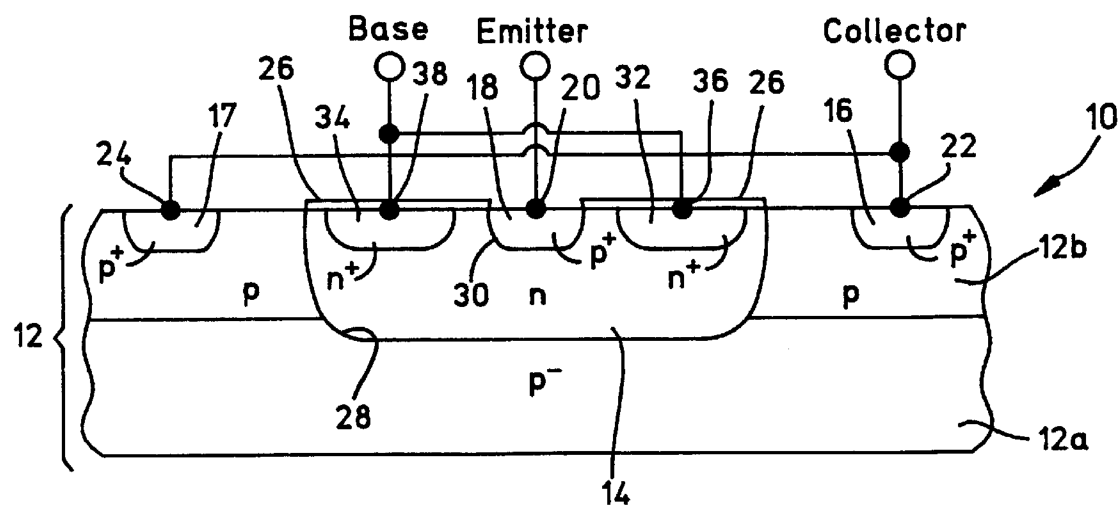
FIG. 3 is a diagrammatic side view showing a modification to the phototransistor of FIG. 1 to add a base contact.

FIG. 3 shows that it is also possible to bias the base of the transistor 10, instead of leaving it floating, by adding a pair of $n^+$ implants 32 and 34 to the n-well 14 on opposite sides of the $p^+$ emitter implant 18. This results in a trade-off between photo current enhancement and an increase in high frequency response. In addition, the design of FIG. 3 allows the phototransistor 10 to be reconfigured, by separately reverse-biasing the emitter-base and collector-base junctions 28 and 30, respectively, such that the device operates as a pair of photodiodes having different frequency sensitivities due to the depths of the aforementioned P-N junctions from the light impinging upper surface of the substrate 12. The $n^+$ base contacts 36 and 38 can also be left floating. In that case, the device operates as it does in FIG. 1, but the low-ohmic base contacts provide increased frequency response.

Figure 4:
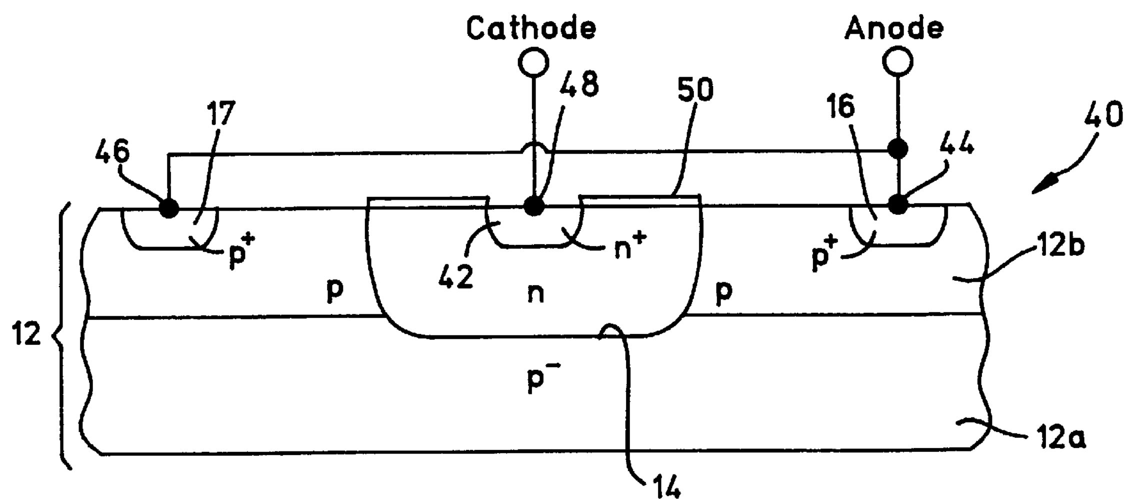
FIG. 4 is a diagrammatic side view of a lateral photodiode constructed in accordance with the present invention on a p-type substrate.

Referring now to FIG. 4, the foregoing process can be readily modified to produce a photodiode 40, rather than a phototransistor 10. This is accomplished by replacing the $p^+$ emitter implant 18 with an $n^-$ implant 42. The $n^-$ implant 42 and the n-well 14 together form a photodiode cathode, while the $p^+$ implants 16 and 17, the p-field 12*b* and the p substrate 12*a* form a photodiode anode. A pair of anode contacts 44 and 46 are electrically connected to the $p^+$ implants 16 and 17, and to each other, while a cathode contact 48 is electrically connected to the $n^+$ implant 42. An anti-reflective coating 50 is preferably applied over at least the cathode region, but could also cover the anode. In the event that the photodiode 40 is constructed using a n-type substrate, the polarities of the foregoing photodiode elements, and the described cathode and anode designations, would be reversed.

Referring now to FIGS. 5 and 6, an npn phototransistor 60 is produced on a semiconductor wafer substrate 62. As shown in FIG. 6(*a*), a $p^-$ type silicon wafer is formed as an incipient layer 62*a* of the substrate 62 of FIG. 1. In a next fabrication step shown in FIG. 6(*b*), a pair of patterned, highly doped $n^+$ regions 64*a* and 65*a* are formed in the surface of the substrate layer 62*a*. The $n^+$ regions 64*a* and 65*a* are spaced apart so that the space-charge regions formed at the P-N junction of the $n^+$ regions 64*a* and 65*a* and the substrate layer 62*a* do not, or only slightly, contact each other for a given reverse bias. FIG. 6(*c*) illustrates a next fabrication step in which the incipient substrate layer 62*a* is grown epitaxially to form an epitaxial layer 62*b* extending over the $n^+$ regions 64*a* and 65*a*, thus making them buried layer regions. The background doping of the epitaxial layer 62*b* is preferably the same as that of the incipient substrate layer 62*a*, namely, $p^-$. Therefore, in the following discussion, both the incipient substrate layer 62*a* and the epitaxial layer 62*b* are referred to as a single $p^-$ substrate 62. In a next fabrication step, shown in FIG. 6(*d*), a pair of reach-through $n^+$ implant regions 64*b* and 65*b* are formed over the buried layer regions 64*a* and 65*a* to provide electrical contact from the upper surface of the substrate 62. Together, the implants 64*a*, 64*b* and 65*a*, 65*b* form collector implants 64 and 65. The semiconductor structures of the photo transistor 60 are completed in a final step, shown in FIG. 6(*e*), by forming an $n^+$ emitter implant 66 in the surface of the substrate 62, between the $n^+$ collector implants 64 and 65. The base of the transistor 60 is formed by the substrate 62 itself, and lies between the collector implants 64 and 65 and the emitter implant 66.

To provide electrical connections to the phototransistor 60, an emitter contact 68 is electrically connected to the emitter implant 68, and a pair of collector contacts 70 and 72 are electrically connected to the collector implants 64 and 65, and to each other. The contacts 68, 70 and 72 are conventional in nature. They are connected to leads that extend to other devices formed on the substrate 62, or to external circuit components. A conventional anti-reflective coating 74 is next applied on the upper surface of the substrate 62, and extends at least over the phototransistor base, but could also cover the collector, and the emitter.

Thus, a second phototransistor of the npn variety has been described. It has a first P-N junction 76 extending from the light impinging surface of the device, and between the substrate 62 as the transistor base, and the collector implants 64 and 65. It has a second P-N junction 78 extending from the light impinging surface of the device, and between the substrate 62 as the transistor base, and the emitter implant 66. As previously stated, an npn phototransistor could be similarly fabricated using an n-type substrate, in which case the polarities of the above-described elements would be reversed.

In the operation, the npn phototransistor 60 functions in similar fashion to the pnp phototransistor 10. However, one difference between the npn phototransistor 60 and the pnp phototransistor 10 is that the low-ohmic collector implants 64 and 65 are not only placed laterally from the emitter-base P-N junction 78, they almost encloses it. This improves the current gain and thus the magnitude of the photo current. A second difference is that the collector-base space-charge region extends almost entirely on the base side of the base-collector P-N junction 76, while in the pnp phototransistor 10, the collector-base space-charge region is formed mostly in the p-collector (12*b*) side of the base-collector P-N junction 28.

The npn phototransistor 60 can also be built with the inclusion a p-field implant in the substrate 62, similar to the p-field implant 12*b* in the substrate 12 of the pnp phototransistor 10. This results in a shifting of the sensitivity/speed trade-off toward higher speeds.

Figure 7:
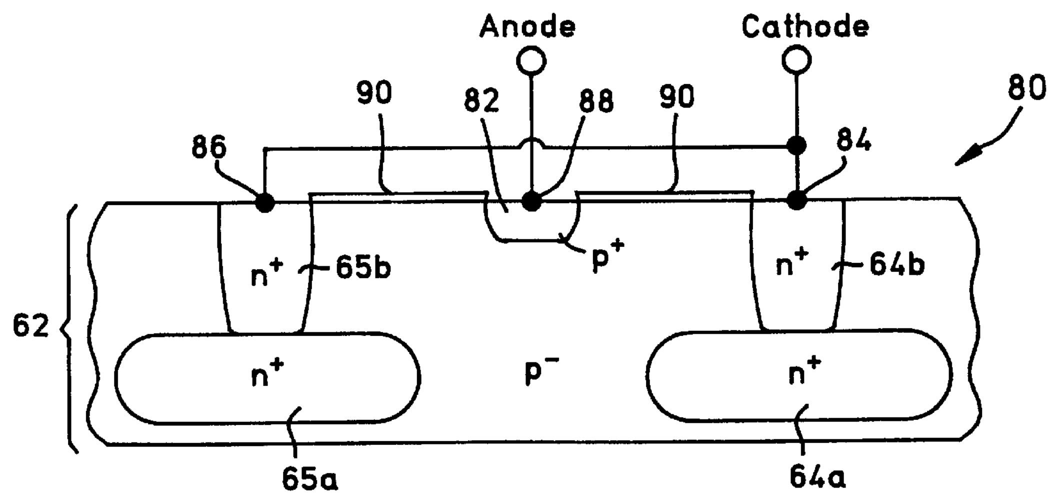
FIG. 7 is a diagrammatic side view of another lateral photodiode constructed in accordance with the present invention on a p-type substrate.

FIG. 7 illustrates that the foregoing process for manufacturing the npn phototransistor 60 can be readily modified to produce a photodiode 80, rather than the phototransistor 60.

This is accomplished by replacing the $n^+$ emitter implant 66 with an $p^+$ implant 82. The $p^+$ implant 82 and the substrate 62 together form a photodiode anode, while the $n^+$ implants 64 and 65 form a photodiode cathode. A pair of cathode contacts 84 and 86 are electrically connected to the $n^+$ implants 64 and 65, and to each other, while an anode contact 88 is electrically connected to the $p^+$ implant 82. An anti-reflective coating 90 is preferably applied over at least anode region, but could also cover the cathode. In the event that the photodiode 80 is constructed using a n-type substrate, the polarities of the foregoing photodiode elements, and the described cathode and anode designations, would be reversed.

Figure 8:
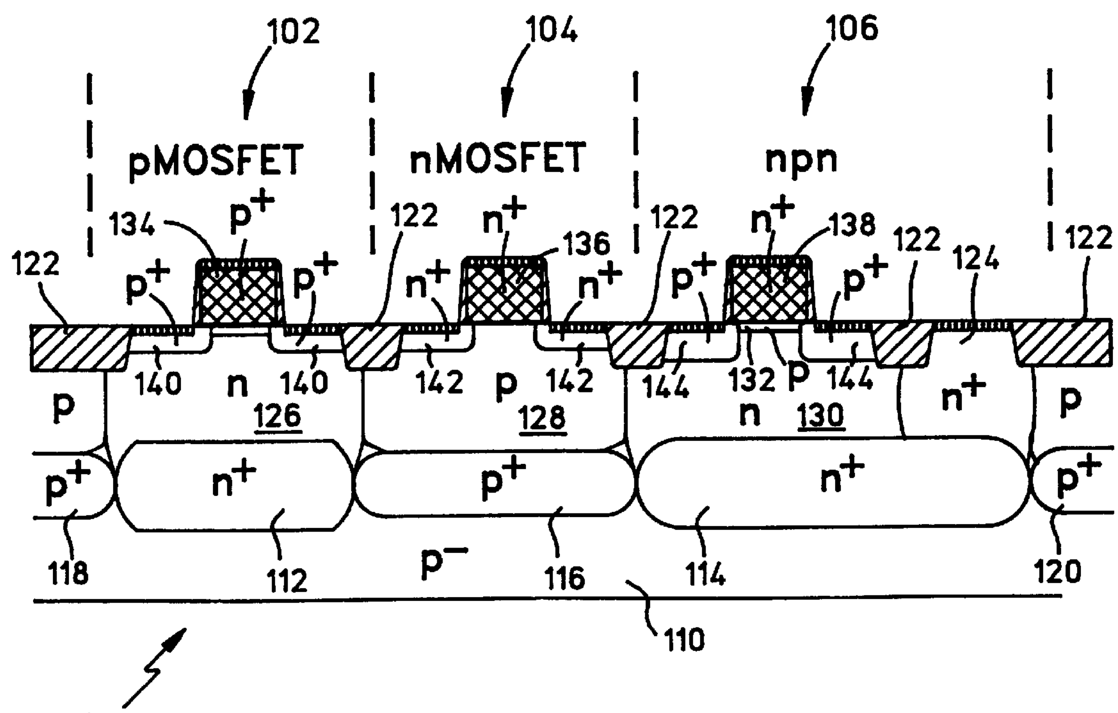
FIG. 8 is a diagrammatic side view showing a conventional BiCMOS structure containing pMOSFET, nMOSFET and bipolar transistor devices.

FIG. 8 shows a conventional BiCMOS structure 100 and serves to illustrate how the photo detectors of the present invention may be fabricated without altering the fundamental BiCMOS fabrication process. The BiCMOS structure 100 is fabricated to include a plurality of pMOSFET devices 102, a plurality of nMOSFET devices 104, and a plurality of bipolar transistors 106, which are typically of the npn variety but could also be pnp transistors. The BiCMOS structure 100 is formed on a lightly doped $p^-$ type silicon wafer substrate 110, but could also be formed on a substrate made from a different p-type semiconductor material, or on an n-type substrate. In the latter case, the polarities of the elements now to be described would be reversed.

Following the formation of the substrate 110, a zero-level mask is used to recess the substrate in a region away from the devices in order to provide an alignment mark for subsequent photolithography. A heavy dose of an negative doping material, such as arsenic, is next implanted using another mask level to form $n^+$ implant regions 112 and 114 that will subsequently underlie the pMOSFET devices 102 and the npn transistor devices 106. A blanket of a high-dose positive doping material, such as boron, is then implanted outside the $n^+$ regions 112 and 114 to form a $p^+$ region 116 that will subsequently underlie the nMOS devices 104, as well auxiliary regions 118 and 120, which are not pertinent to the present disclosure. The $p^+$ dose is preferably kept low enough so that the $n^+$ regions 112 and 114 are not compensated by the positive doping material. Otherwise, an additional mask level should be used.

An undoped epitaxial layer is next grown onto the wafer substrate 110. This transforms the $n^+$ implant regions 112 and 114, and the $p^+$ implant region 114, into buried layers. A patterned field oxide layer 122 is then grown or deposited using another mask to form windows for the nMOSFET and pMOSFET devices 102 and 104, the emitter-base region of the npn transistors 106, and the collector region of the npn transistors 106. A reach-through contact 124 of the $n^+$ type is next implanted in the npn collector window using a mask. The reach-through contact extends from the upper surface of the substrate 110 to the $n^+$ buried implant 114, which forms a subcollector for the npn transistors 106. Two masks are then used to implant medium doses of a negative doping material, such as phosphorous, and a positive doping material, such as boron. These dopings form an n-well 126 underlying the pMOSFET devices 102, a p-well 128 underlying the nMOSFET devices 104, and an n-collector 130 for the npn transistors 106. A gate oxide is next grown and then removed from the npn transistor windows by using a block-out mask. A combined MOSFET gate and npn emitter polysilicon film layer is then deposited.

The fabrication process continues with a shallow doping of a positive doping material such as boron, using a block-out mask, to form a p-implant 132 for the intrinsic base region of the npn transistors 106. A thicker polysilicon film is then deposited to complete the formation of gates 134 and 136 of the CMOS devices and to complete the formation of an npn emitter 138. Two block out masks are used to dope the polysilicon of the $n^+$ and $p^+$ CMOS gates 134 and 136, and the $n^+$ emitter 138. The polysilicon is then patterned at minimum lithographic line width. Dielectric spacer sidewalls are formed along the sides of the CMOS gates 134 and 136, and the npn emitter 138.

The BiCMOS process continues with two block-out masks being used to implant high doses of a negative doping material such as antimony or arsenic, and a positive doping material such as boron, to form the source and drain junctions (S/D) 140 and 142 of the CMOS devices 102 and 104, respectively, and the extrinsic base implants 144 of the npn transistors 106. A dielectric film is then deposited for isolation and metal contacts are formed to the CMOS and bipolar devices to complete the fabrication process.

Referring now to FIGS. 1 and 2, it will be seen that the pnp phototransistor 10 can be readily formed without significant modification of the BiCMOS fabrication process used to produce the BiCMOS structure of FIG. 8. Thus, the $p^-$ and p substrate layers 12*a* and 12*b* of FIGS. 1 and 2, which are utilized to provide the intrinsic collector of the phototransistor 10, can be formed as part of the processing of the substrate 110 of FIG. 8, which is a $p^-$ wafer having an epitaxial p layer grown thereon. The n-well 14 of FIGS. 1 and 2, which is utilized as the base of the phototransistor 10, can be formed as part of the processing of the n-well 126 of the pCMOS devices 104, and the n-collector region 130 of the npn transistors 106, of FIG. 8. The $p^+$ implants 16 and 17 of FIGS. 1 and 2, which are utilized to provide the extrinsic collector of the phototransistor 10, can be formed as part of the processing used to create of the $p^+$ source/drain implants 140 of the pMOS devices 102, and the extrinsic $p^+$ base contacts 144 of the npn transistors 106, of FIG. 8. The $p^+$ implant 18 of FIGS. 1 and 2, which is utilized to provide the emitter of the phototransistor 10, can be also be formed at the same time.

If it is desired to add the base contacts 32 and 34 to the phototransistor 10, as shown in FIG. 3, these can be formed as part of the processing used to create of the $n^+$ source/drain implants 142 of the nMOS devices 104 of FIG. 8. If it is desired to produce the photodiode 40, as shown in FIG. 4, the $n^+$ implant 42, which is utilized as part of the photodiode cathode, can also be formed as part of the processing used to create of the $n^+$ source/drain implants 142 of the nMOS devices 104 of FIG. 8.

Referring now to FIGS. 5 and 6, it will be seen that the npn phototransistor 60 can also be readily formed without significant modification of the BiCMOS fabrication process used to produce the BiCMOS structure of FIG. 8. Thus, the $p^-$ substrate layers 62*a* and 62*b* of FIGS. 5 and 6, which are utilized to provide the base of the phototransistor 60, can be formed as part of the processing of the substrate 110 of FIG. 8, which is a $p^-$ wafer having an epitaxial layer grown thereon that could also have a $p^-$ doping. The $n^+$ buried layers 64*a* and 65*a* of FIGS. 5 and 6, which are utilized as the subcollector of the phototransistor 60, can be formed as part of the processing of the $n^+$ buried layer 112 of the pMOS devices 104, and the $n^+$ buried layer of the 114 of the npn transistors 106, of FIG. 8. The $n^+$ reach-through contacts 64*b* and 65*b* of FIGS. 5 and 6, which are utilized to provide the extrinsic collector of the phototransistor 60, can be formed as part of the processing used to create of the $n^+$ reach-through contact 124 of the npn transistors 106 of FIG. 8. The $n^+$ implant 66 of FIGS. 5 and 6, which is utilized to provide the emitter of the phototransistor 60, can be formed as part of the processing of the $n^+$ source/drain implants 142 of the nMOS devices 104 of FIG. 8.

If it is desired to produce the photodiode 80, as shown in FIG. 7, the $p^+$ implant 82, which is utilized as part of the photodiode anode, can be formed as part of the processing used to create of the $p^+$ source/drain implants 140 of the pMOS devices 102 of FIG. 8.

Accordingly, a lateral semiconductor photo detector of novel design, and a process for manufacturing such photo detectors that is advantageously compatible with BiCMOS fabrication herein. It is understood, therefore, that the invention is not to be in any way limited except in accordance with the spirit of the appended claims and their equivalents.

We claim:

1. A method for manufacturing a lateral semiconductor photo detector device, comprising:

forming a doped semiconductor wafer substrate having a selected polarity and doping concentration;

forming a first doped semiconductor well in the surface of said substrate, said first well having a selected polarity and doping concentration;

creating an enhanced doping region of said substrate surrounding said first well and extending for a selected distance below the surface of said substrate;

forming a pair of second and third doped semiconductor wells in the surface of said substrate on opposite sides of said first well, said second and third wells having selected polarity and doping concentrations that are identical to each other;

forming a fourth doped semiconductor well in the surface of said first well, said fourth well having a selected polarity and doping concentration;

defining a first P-N junction in said device between said first well and said second and third wells, and extending to the surface of said substrate;

mounting a first electrical contact on said fourth well;

mounting a pair of second and third electrical contacts on said second and third wells and connecting said second and third contacts to each other;

applying an anti-reflective coating on said device to define a light receiving area located over at least the portions of said first well that are not covered by said fourth well; and wherein either (1) said forth well is formed to have a polarity which is opposite to that of said first well, and the interface between said first and fourth wells forms a second P-N junction, such that said photo detector functions as a phototransistor with said first well forming a base, said substrate and second and third wells forming a collector, and said fourth well forming an emitter, or (2) said fourth well is formed to have the same polarity as said first well, such that said photo detector functions as a photodiode with said first and fourth wells forming a cathode (or anode), and said substrate and said second and third wells forming an anode (or cathode).

2. The method of claim 1, wherein said second and third wells and said substrate are formed to have a polarity which is opposite to that of said first well, and the interface between said substrate and said first well forms said first P-N junction.

3. The method claim 2, further comprising:

forming fifth and sixth wells in the surface of said first well on opposite sides of said fourth well, said fifth and sixth wells having the same polarity as said first well, and mounting fourth and fifth electrical contacts, respectively, on to said fifth and sixth wells and connecting said fourth and fifth contacts to each other.

4. A method for manufacturing a lateral semiconductor photo detector device, comprising:

forming a doped semiconductor wafer substrate having a selected polarity and doping concentration;

forming a pair of first and second doped semiconductor regions in the surface of said substrate, said first and second regions having selected polarity and doping concentrations that are identical to each other;

growing said substrate above said first and second regions, such that said first and second regions become buried regions within said substrate;

forming a pair of first and second doped semiconductor reach-through contacts in said substrate extending from the surface of said substrate to said first and second buried regions, said first and second reach-through contacts having the same polarity as said first and second buried regions such that said first and second reach-through contracts and said first and second buried regions become first and second doped semiconductor wells extending to the surface of said substrate;

forming a third doped semiconductor well in the surface of said substrate between said first and second wells, said third well having a selected polarity and doping concentration;

defining a first P-N junction in said device between said first and second wells and said third well, and extending to the surface of said substrate;

mounting a pair of first and second electrical contacts to said first and second wells and connecting said first and second electrical contacts to each other;

mounting a third electrical contact to said third well;

applying an anti-reflective coating on said device to define a light receiving area between at least said first and second wells and said third well; and wherein either (1) said third well is formed to have the same polarity as said first and second wells and the interface between said third well and said substrate defines a second P-N junction, such that said photo detector functions as a phototransistor with said substrate forming a base between said first and second P-N junctions, said first and second wells forming a collector, and said third well forming an emitter, or (2) said third well is formed to have the same polarity as said substrate, such that said photo detector functions as a photodiode with said first and second wells forming a cathode (or anode), and said third well and said substrate forming an anode (or cathode).

5. The method of claim 4, wherein said first and second wells and said substrate are formed to have opposite polarities and the interface between said first and second wells and said substrate defines said first P-N junction.

6. The method of claim 5, wherein said first and second buried regions of said first and second wells comprise buried layers which are wider than said first and second reach-through contacts, but which are spaced apart from each other such that space charge regions formed at said first P-N junction as a result of operational reverse biasing levels do not overlap.

* * * * *